(12) United States Patent
Freeman et al.

(10) Patent No.: US 6,558,506 B1
(45) Date of Patent: May 6, 2003

(54) ETCHING SYSTEM AND ETCHING CHAMBER

(75) Inventors: Richard J. Freeman, Wenham, MA (US); Jay R. Wallace, Danvers, MA (US); Yoichi Kurono, South Hamilton, MA (US); Arthur H. Laflamme, Jr., Rowley, MA (US); Louise Smith Barriss, North Reading, MA (US); Tadashi Onishi, Salem, MA (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/889,582

(22) PCT Filed: Feb. 1, 2000

(86) PCT No.: PCT/US00/00510
§ 371 (c)(1),
(2), (4) Date: Oct. 24, 2001

(87) PCT Pub. No.: WO00/45425
PCT Pub. Date: Aug. 3, 2000

Related U.S. Application Data
(60) Provisional application No. 60/118,123, filed on Feb. 1, 1999.

(51) Int. Cl.$^7$ .............................................. H01L 21/00
(52) U.S. Cl. ............................ 156/345.32; 156/345.31; 204/298.35
(58) Field of Search ....................... 156/345.32, 345.31; 118/719; 204/298.35

(56) References Cited

U.S. PATENT DOCUMENTS 5,611,861 A * 3/1997 Kumiko ...................... 118/719

* cited by examiner

Primary Examiner—Thi Dang
(74) Attorney, Agent, or Firm—Oblon, Spivak, McClelland, Maier & Neustadt, P.C.

(57) ABSTRACT

The present invention provides an etching system having a plurality of etching chambers (16, 18, 20) disposed about a transfer chamber (14), wherein the etching chambers are adapted to be selectively mounted at different positions with respect to the transfer chamber.

20 Claims, 11 Drawing Sheets

ETCHING SYSTEM AND ETCHING CHAMBER

This application claims priority under 35 U.S.C. 119(e) to U.S. Provisional Application Ser. No. 60/118,123 filed Feb. 1, 1999.

BACKGROUND OF THE INVENTION

1. Field of the Invention

The invention relates to etching equipment utilized, for example, in the manufacture of semiconductor devices. The invention provides improved etching chambers and etching systems which are simpler to manufacture and maintain, and which can be easily modified if desired.

2. Discussion of the Background

Etching equipment is utilized in the manufacture of integrated circuits and other electrical devices. In a typical etching system, workpieces such as semiconductor wafers are retrieved from a wafer cassette by a robot arm which is located in a transfer chamber. The robot arm then transfers the wafers to one or more etching chambers which are disposed about the transfer chamber. Although such systems have long been in use, they are typically complex to manufacture, assemble and maintain. Moreover, prior systems can be limited in their ability to be modified, particularly in a relatively short period of time. For example, sometimes it can be desirable to replace one or more of the chambers of a given system with a different type of etch chamber, for example, to modify the fabrication line, or to replace an older model chamber with an updated model. Thus, the chambers of a system could be replaced with a new chamber, or a line could be reconfigured by exchanging chambers between or among different systems. However, replacement of a chamber is quite cumbersome, requiring awkward equipment, such as a Johnson bar, to lift, move and position a chamber in place such that the chamber can be connected to the transfer chamber as well as various frame components. Further, prior systems have included a number of complex components including, for example, a complex drive assembly for raising and lowering the lower electrode (which holds a wafer during etching) and a complex cooling system for the lower electrode. Such systems are not only more complicated to manufacture, but also can be less reliable or, at least, require more labor to ensure proper operation.

A further shortcoming with existing systems is that an excessive number of parts are often required, thus complicating the manufacture and assembly of etching chambers and systems, and making system modifications more difficult. For example, in the past, a given chamber has been particularly adapted to be located at a specific side or location with respect to the transfer chamber, e.g., the left side, while another chamber was particularly adapted for fitting to the right side of the transfer chamber. Such an arrangement not only complicates the manufacture of the chambers, since a larger number of parts must be manufactured and maintained in inventory, but also, the systems are less flexible in their ability to be modified, for example, if a semiconductor fabrication facility desires to replace or exchange chambers, since the replacement or exchange is limited by the right hand/left hand mountings of the chambers.

Certain etching chambers also utilize a magnet assembly which rotates about the chamber and imparts a magnetic field to the plasma within the chamber. In the past, the magnet assembly has been rotatably mounted on top of a bearing assembly to support the magnets for rotation. Such an arrangement has been recognized as disadvantageous in that the height of the chamber must be increased to accommodate the height of not only the magnets but also the bearing assembly. The increased height of the chamber makes access to the chamber more cumbersome (since chambers are typically accessed for maintenance through the top of the chamber) and also, the drive for the lower electrode must have a sufficient stroke length to raise the wafer up into the desired position within the magnets for etching.

Accordingly, it is desired to provide simplified etching systems and etching chambers, which are easier to manufacture, maintain, use and, if desired, to modify.

SUMMARY OF THE INVENTION

It is an object of the invention to provide an etching system which is simpler to manufacture, assemble and maintain.

It is a further object of the invention to provide an etching system in which the system is more readily modifiable, for example, if it is desirable to reconfigure a system or fabrication line by replacing the chambers of the system or by exchanging chambers between/among systems.

It is a further object of the invention to provide an etching system and etching chamber in which the components are simplified, more reliable, and/or easier to use.

It is a further object of the invention to provide an etching system having a reduced footprint (i.e., reduced floor space requirements), and in which components of the system are more easily accessible for maintenance and inspection.

These and other objects and advantages are achieved in accordance with the present invention in which an etching system is provided having a plurality of etching chambers disposed about a transfer chamber. In accordance with one aspect of the invention, the chambers are unisex or ambidextrous. In other words, the same chamber can be mounted at various locations about the transfer chamber. Accordingly, different chambers are not needed for different sites about the transfer chamber. As a result, different system configurations are more readily achieved (i.e., chambers can be more conveniently replaced or exchanged), and the number of parts required to manufacture the etching system (and chambers of the system) is decreased.

In accordance with a further aspect of the invention, the chambers are more modularized. In other words, the chambers can be more readily positioned and coupled to the transfer chamber. As a result, the assembly of the system is simplified, and reconfiguration of a system (e.g., replacing one type of chamber with another type of chamber) can be performed more quickly and conveniently. In addition, if a chamber is defective or in need of repair, the chamber can be quickly replaced with a chamber of the same type.

Further, in accordance with the invention, various components of the system and chambers are improved and simplified. In accordance with one aspect, the drive assembly which raises and lowers the lower electrode is simplified. The new drive assembly is advantageous in that it requires less space than prior arrangements. Further, an improved and simplified back cooling system is provided. The system is improved in that the components of the system, except for the supply source of the heat transfer medium, are located below the lower electrode. In the past, control components of the system were disposed either on the frame of the etching system or in a utilities cabinet. Such a prior system was not only complex in that a larger number of control devices were required, but also the cooling system was more difficult to control, since the coolant was controlled more remotely from the location at which the required cooling takes place. Thus, the system was slower to respond to required changes in the flow of the heat transfer medium.

By mounting the wafer back cooling system components below the lower electrode and for movement with the lower electrode, the cooling system is simplified and responds more quickly to changes required in the gas flow rate of the system. The improved cooling system and drive system are particularly advantageous in combination, since the placement of the cooling system below the lower electrode is more easily achieved with the simplified drive arrangement of the invention.

The invention further provides additional improvements in system and chamber components. For example, an improved mounting arrangement for rotatably mounting a rotating magnet assembly is provided which reduces the height of the chamber, and thus reduces the stroke of the drive required for the lower electrode. The reduced stroke is also advantageous in that the product throughput can be increased, since the time required for the drive to complete a stroke is reduced. Further, the reduced height provides for more convenient access to the chamber for maintenance or repair.

In accordance with a further aspect of the invention, an improved assembly is provided for opening the lid of the respective chambers. This lid mounting assembly is more convenient to use and is also safer than prior arrangements.

BRIEF DESCRIPTION OF THE DRAWINGS

The above and other objects and advantages of the present invention will be readily understood in view of the following detailed description, particularly when considered in conjunction with the drawing figures in which.

DETAILED DESCRIPTION OF THE PREFERRED EMBODIMENTS

Figure 1:
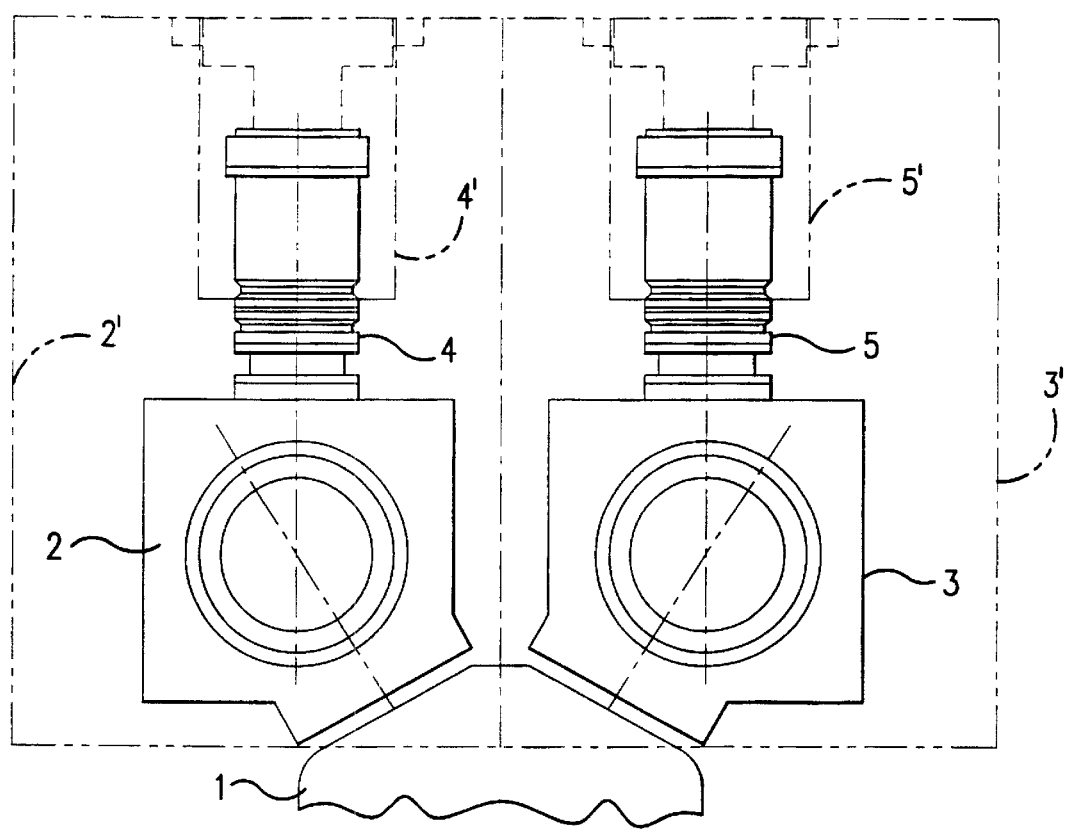
FIG. 1 is a plan view of a portion of a prior etching system.

FIG. 1 depicts a portion of an arrangement of a prior etching system, including a portion of the transfer chamber 1, and a pair of etch chambers 2, 3 which are coupled to the etch chambers. Turbomolecular pumps 4, 5 are provided for the chambers 2, 3, with the turbomolecular pumps extending horizontally from the chambers and mounted upon slide mounting structures 4', 5'. Further, frame assemblies, represented schematically by broken lines 2', 3' are provided for the etch chambers 2, 3. As is apparent, the chambers 2, 3 are configured to be mounted at their specific locations indicated. In other words, the chamber 3 is not suited to be mounted at the location of chamber 2 and vice versa. Further, mounting of the assemblies is quite cumbersome, requiring the use of Johnson bars in order to position the chambers with respect to the transfer chamber 1, and also with respect to the frame (not shown) of the transfer chamber 1. In positioning and mounting the chambers, the frames 2', 3' must also be positioned with respect to one another. When the system is fully assembled, the frames 2', 3' are connected to each other and they are also connected to the frame of the transfer chamber 1. In addition, the chambers 2, 3 are fastened to the transfer chamber 1. This positioning is quite cumbersome in view of the size and weight of the chambers.

In the arrangement of FIG. 1, a further shortcoming resides in the structure utilized for opening of the lid of the chamber. In the past, a hinged lid arrangement has been utilized, resulting in a number of shortcomings. First, when the lid is open, it is located adjacent to the chamber and presents an obstacle in accessing the chamber. Second, since the lid and the hinge of the lid are disposed at a fixed location with respect to the chamber, the open position of the lid is also fixed and the position of the lid cannot be varied to accommodate different system configurations or locations of the system within a clean room, and further, the lid cannot be moved to different locations (i.e., when the lid is open) for different maintenance operations. In addition, since the lid of the chamber is heavy, prior hinge mountings have been spring loaded to reduce the amount of force required to open the lid. However, such a spring loading can be dangerous if the lid is not opened carefully. Moreover, if the electrode or other structure of the lid has been removed for maintenance, the lid becomes lighter and the spring loading can cause the lid to open quickly and risk injury.

Figure 2:
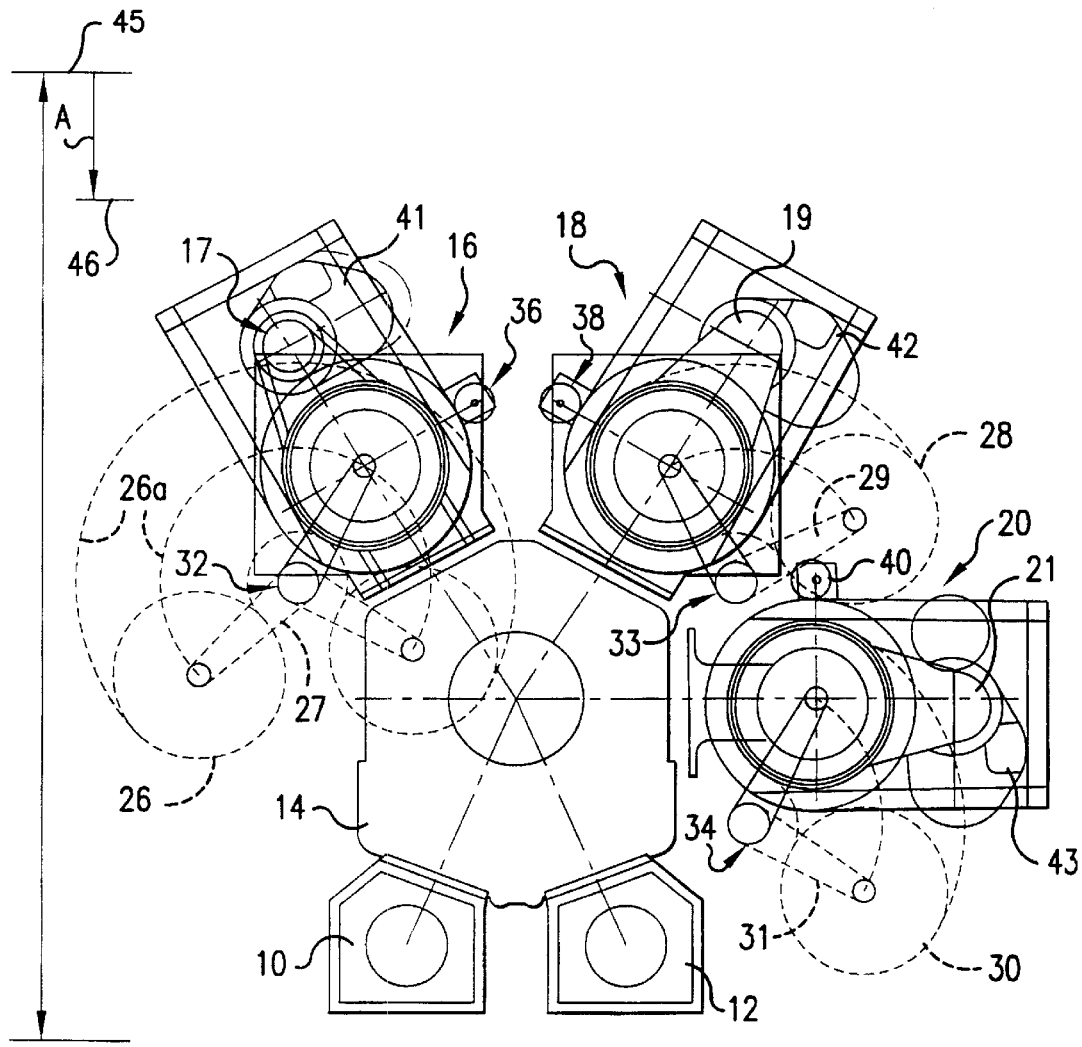
FIG. 2 is a plan view of an etching system in accordance with the invention.

FIG. 2 provides an arrangement in accordance with the present invention which includes a number of advantages as compared with the arrangement of FIG. 1. As shown in FIG. 2, the complete system can include one or more cassette chambers 10, 12, from which substrates to be processed, e.g., semiconductor wafers, are retrieved and returned before and after etching. The wafers are retrieved and returned to/from the cassettes 10, 12 by a robot arm located within a transfer chamber 14. Disposed about the chamber are one or more treatment or etching chambers 16, 18, 20. In accordance with one of the advantageous aspects of the present invention, the chambers 16, 18, 20 can be mounted at different locations about the transfer chamber 14. Preferably, the chambers 16, 18, 20 have the same external physical structure, thereby reducing the number of parts required in order to manufacture the chambers. In other words, different parts are not required as a result of a different desired position for a given chamber. Thus, as is apparent from FIG. 2, the chambers are unisex or ambidextrous. By contrast, as shown in FIG. 1, the chamber housing, body or connecting parts for chamber 2 are different from that of chamber 3 by virtue of the different location at which the chamber is intended to be mounted.

As is also apparent from the FIG. 2 arrangement, the unisex or ambidextrous configuration of the chambers 16, 18, 20, also allows the system (or, more particularly, transfer chamber 14) to more readily receive a third, and possibly even a fourth, chamber. By contrast, the arrangement of FIG. 1 was restricted to only two etching chambers. Thus, by providing chambers 16, 18, 20 having a unisex or ambidextrous mounting and housing structures, the chambers can be more easily manufactured (since they each have the same parts and configurations) and the overall system is more flexible as to the locations at which the chambers can be positioned and the number of chambers which can be positioned about the transfer chamber 14. Preferably, even where different types of chambers (e.g., if one is an oxide etcher and another is a polysilicon etcher) are utilized, the chambers will each be ambidextrous or symmetrical in terms of their mounting to the transfer chamber, so that the etch systems can be more readily reconfigured by replacing or exchanging chambers of different types.

A further advantage of the arrangement of FIG. 2 is that the lids 26, 28, 30 lift and pivot for opening. (Open positions of the lids are shown with broken lines.) Such an arrangement is advantageous in a number of respects. First, when the lids are open, they can be placed at various pivot positions and they can be positioned further away from the chamber for access to the chamber and other components of the system. Thus, the lids are not an obstacle to maintenance personnel. For example, as shown in FIG. 2, the lid 26 can be positioned at various locations about the arc 26a (shown in broken line) so that the lid can be placed at a location most convenient for access to the chamber and/or the upper electrode assembly.

The lids are mounted upon arms 27, 29, 31, and the arms pivot about respective vertical shafts of the lid assemblies 32, 33, 34. To open the lids, the lid is first raised a predetermined amount as the arms 27, 29, 31 move upwardly via vertical shafts of the lid mounting assemblies 32, 33, 34 (discussed in further detail hereinafter). The lids can then be pivoted away from the chambers. Such an arrangement is advantageous as compared with the hinged lid approach, since the vertical movement of the pivoting lids can be limited, and thus, upon opening, even if the lid is of reduced weight by removal of certain components (e.g., if the upper electrode has been removed), the vertical stroke of the lid is limited, thereby avoiding the possibility that the lid will fly away and injure the user. In addition, the force of any spring loading (or other means, such as a pneumatic cylinder assist) which assist lifting of the lid is less dangerous than prior hinged lid arrangements, since the lifting action with the present invention is in a single direction (along the axis of the vertical shaft). By contrast, with a hinged lid, a large amount of spring force/torque is required upon initial opening of the lid. However, once the hinged lid is further pivoted, a portion of the lid weight is supported by the hinge, and the spring force becomes excessive. The arrangement of the present invention is safer in that weight of the lid which is to be counteracted by the spring assist (or other means) is constant, and thus, the lid is less likely to fly away and injure the user or maintenance person. As discussed earlier, the lid mounting arrangement of the present invention is also advantageous in that the lids can be positioned at various open locations, so that the lids do not present an obstacle to maintenance personnel accessing the interior of the chamber.

In accordance with a further aspect of the invention, the chambers are configured so that at least two mounting sites are provided for the lid mounting assemblies 32, 33, 34. In particular, as shown in FIG. 2, the chamber 16 has a lid which is positioned at a site which is to the left of the chamber. At least one further site is provided for the assembly 32 so that the lid can alternatively be mounted on the opposite side of the chamber as shown, for example, by the mounting of the lid assembly 33 to the right side of chamber 18. Thus, by providing two (or more if desired) mounting sites for the lid mounting assemblies 32, 33, 34, the lid can be mounted at different sites about the transfer chamber, and the pivoting stroke of the lid can be disposed in the region most convenient in terms of the location at which the chamber is disposed and/or the location at which the system is disposed. Thus, the variable mounting of the lids further enhances the flexibility of the chambers and the modularity of the chambers as system components (i.e., a given chamber can be more readily mounted at various positions about a transfer chamber, and the lid can be mounted at a position most convenient for the selected chamber position).

It is to be understood that various features of the present invention are applicable to a wide variety of chamber types. Certain types of chambers include a rotating magnet assembly. In accordance with a further optional aspect of the invention, if a rotating magnet type chamber is utilized, the mounting site for the motor or drive for the magnets is the same as that provided for the pivoting chamber lid assemblies. In particular, as shown in FIG. 2, magnet drives represented at 36, 38 (i.e., for rotating the magnet assembly) are respectively disposed to the right and left of the chambers 16, 18. However, the structures of the chambers are the same or symmetrical. For the chamber 16, the drive 36 is disposed at a mounting site to the right of the chamber while the vertical shaft assembly 32 for mounting the lid is disposed at a mounting site to the left of the chamber. For chamber 18, the positions are reversed. In accordance with a preferred feature of the invention, this change in position is conveniently achieved by utilizing a mounting site for the magnet drive which is the same as that utilized for the lid mount (a universal mount). If desired, additional mounting sites can be provided for further flexibility in the mounting position for the lid assembly or other components. Thus, in accordance with a further advantageous aspect of the present invention, plural mounting sites are provided for the lid assembly, and in addition, if there are additional components for which flexible positioning is desired (such as a motor for driving a rotating magnet), the mount for such components is preferably universal, or in other words, the same as that utilized for the lid assembly.

Figure 3A:
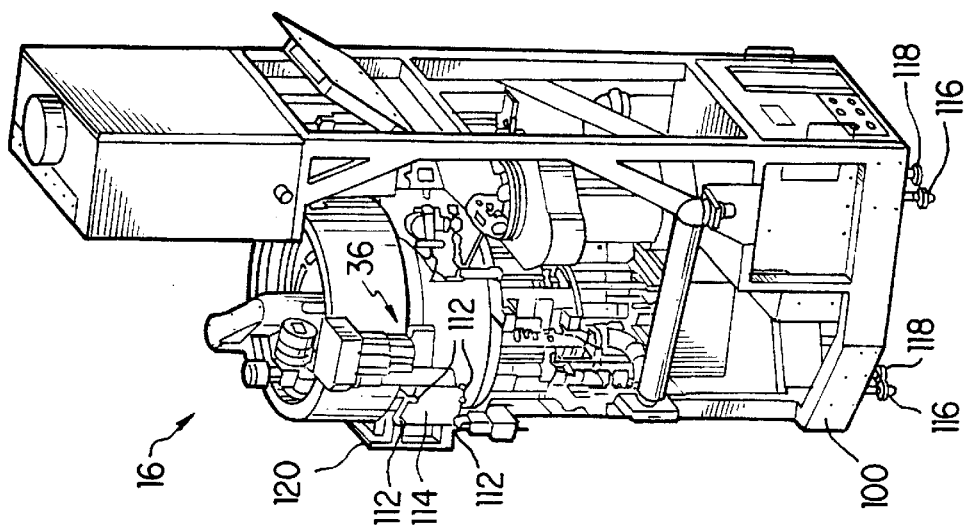
FIGS. 3A and 3B are perspective views of an etch chamber module of FIG. 2.
Figure 3B:
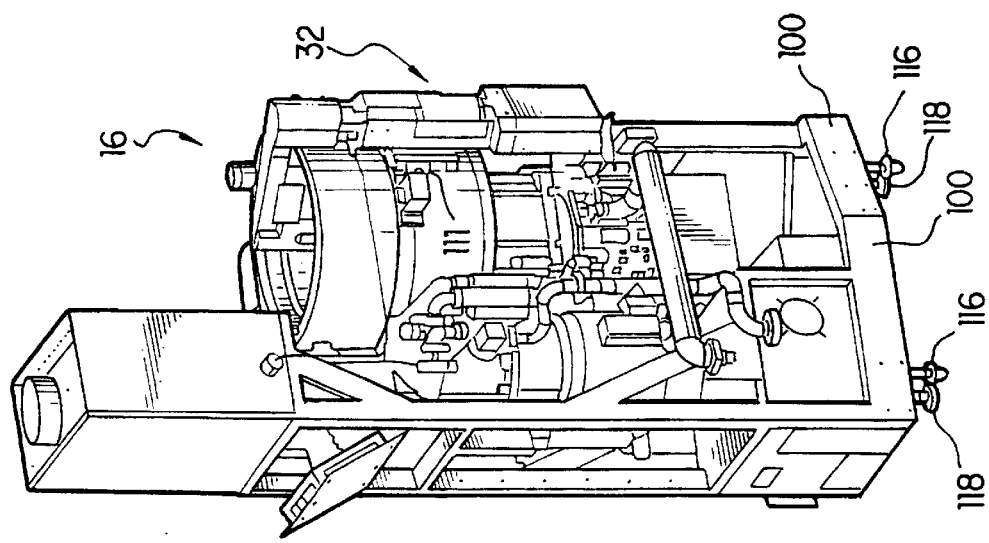

Referring briefly to FIGS. 3A and 3B perspective views of one of the chambers 16 of FIG. 2 are shown. As shown in FIGS. 3A and 3B, the mounting sites can each include, for example, a machined surface (e.g., a flat or ribbed surface) 111 disposed on the chamber and having four apertures to receive bolts 112 in order to hold the lid mounting assembly 32 or the magnet drive 36 (or other component) in place. The lid mounting assembly 32 includes a corresponding structure, including a mounting flange having apertures through which the fasteners extend to connect the flange of the vertical shaft assembly to the mounting site. (The flange of the lid mounting assembly is more easily seen at 113 in FIGS. 8B and 8C.) Similarly, the drive assembly 36 includes a flange 114 through which the fasteners 112 extend to hold the drive assembly 36 in place. As discussed earlier, and as should be apparent from FIGS. 3A and 3B, since a common (or universal) mounting site is provided for the lid mount and for the drive mount, the positions of the lid and drive can be readily reversed, thus enhancing the flexibility of the chamber, and also further easing the ability of the chamber to be utilized at various positions about a transfer chamber of a multichamber system. Although an arrangement is shown in which four fasteners extend through apertures of a component flange (e.g., a lid or drive assembly flange) and chamber mounting site, it is to be understood that various mounting site arrangements are possible. For example, the mounting site could include a slot or socket which receives an appropriately shaped member connected to the lid mounting assembly or drive assembly (or other component for which it is desirable to position at different locations about the chamber), or any other suitable mounting expedient. However, as discussed earlier, preferably the plural mounting sites are the same and, if more than one component is desired to be positioned at different locations about the chamber, such components should each be compatible with the common or universal mounting sites.

Still referring to FIGS. 3A and 3B, the modularity of the chamber, and the ease with which the chamber 16 can be positioned with respect to the remainder of the etching system (particularly the transfer chamber) will be appreciated. As shown in FIGS. 3A and 3B, the chamber 16 is framed with a support frame structure such that it can be readily moved and is self-supporting. The chamber module (i.e., the framed chamber assembly) includes a plurality of roller mounted feet 116, four of which are shown in the embodiment of FIGS. 3A and 3B. The roller mount can be, for example, a spherical roller, which allows the chamber to be easily positioned at the desired location adjacent to the transfer chamber. Once positioned, the chamber can be coupled to the transfer chamber utilizing a fastener flange 120, which has apertures which are aligned with corresponding apertures on the transfer chamber, so that the etching chamber and transfer chamber can be coupled together by fasteners extending through the aligned apertures.

The roller feet 116 are retractably mounted, as are additional non-rollered feet 118, with the additional feet 118 utilized for holding the chamber module in place after it has been positioned. For positioning of the chamber 16, the feet 118 are in a raised position so that they do not interfere with movement of the chamber module upon the roller feet 116. After the chamber is positioned, the feet 118 are lowered, and the feet 116 can be raised, such that the roller feet are now retracted and the chamber is supported by the non-rollered feet 118. The feet 116, 118 can be mounted, e.g., upon threaded shafts which are received within threaded bores, such that the raising and lowering of the feet is accomplished by rotating the threaded shafts. By providing the easy positioning and modular chamber configuration in accordance with the present invention, the etching system can be installed more conveniently during its initial assembly. In addition, systems can be more easily reconfigured, for example, if it is desirable to replace or exchange types of chambers of a particular system. Further, if a chamber is defective or in need of repair, it can be quickly replaced with a chamber of the same type with a reduced downtime as compared with prior systems in which either a cumbersome chamber replacement operation was required or in which the chamber was repaired in place (i.e., connected to the system).

In accordance with a further aspect of the present invention, the turbomolecular pumps 41, 42, 43 are vertically mounted, with the chambers each having an elbowed portion 17, 19, 21 extending to the turbomolecular pumps 41, 42, 43. With this arrangement, the footprint or floor space requirements of the system are significantly reduced as compared with the FIG. 1 arrangement. In particular, the length of the system is reduced, as indicated by arrow A, from that of the prior arrangement. In FIG. 2, the line indicated at 45 represents the overall length of the system of the FIG. 1 arrangement, while the arrow A represents the reduction in length (to line 46) achieved by the arrangement of the present invention. With the arrangement of the present invention, a length reduction of the system of approximately sixteen inches has been achieved. Such a space savings is extremely desirable within a clean room where floor space is expensive.

Figure 4:
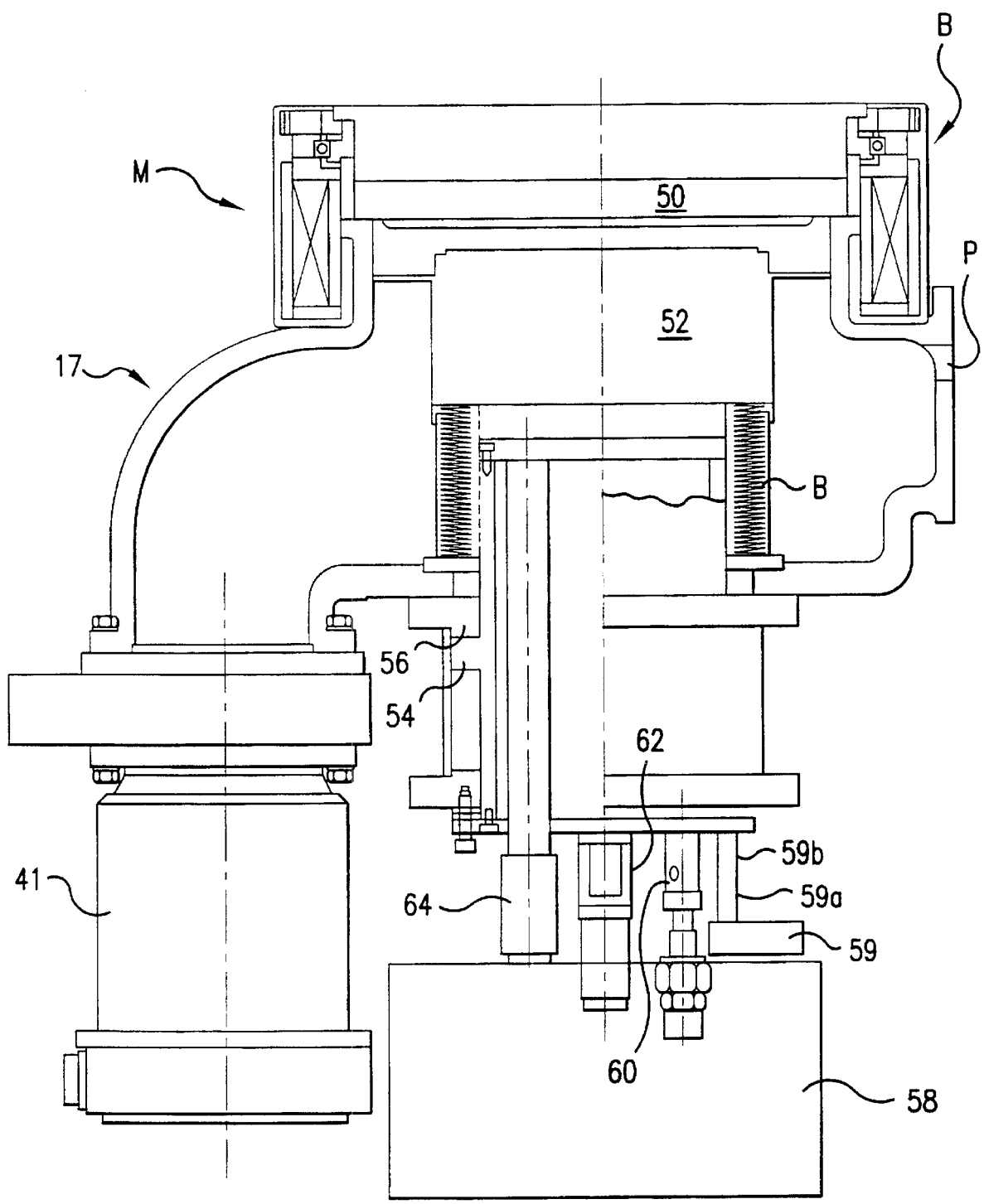
FIG. 4 is an exemplary embodiment of a chamber arrangement of the present invention which is shown in partial cross-section.

Referring now to FIG. 4, additional advantageous aspects of the present invention will become apparent. In the FIG. 4 arrangement, a cross-sectional view of a chamber having a rotating magnet assembly M is shown. However, it is to be understood that various aspects of the present invention are applicable to various types of chambers, including chambers which do not have rotating magnet assemblies. As discussed earlier and as better shown in FIG. 4, the chamber preferably includes an elbowed portion 17, so that the turbomolecular pump 41 can be disposed vertically. FIG. 4 also depicts additional advantageous features of the present invention including an improved drive assembly for raising and lowering the lower electrode, and also an improved mounting or suspension arrangement for the rotating magnet M. In FIG. 4, the upper electrode is shown at 50, while the lower electrode is shown at 52. The lower electrode is vertically movable, so that in a first position the lower electrode can receive a wafer, and after the wafer is placed upon the lower electrode, the lower electrode and wafer can then be raised for etching. In addition, as discussed further hereinafter, a third position (or more positions) can be desirable for a cleaning process or possibly a different etching process. In order to accommodate for movement of the lower electrode, a bellows arrangement B is provided to isolate the vacuum or reduced pressure within the chamber, and also to prevent rotation of the lower electrode. As shown, the bellows B are an accordion-like cover structure. As discussed in further detail hereinafter, in accordance with one of the advantageous aspects of the present invention, the stroke of the lower electrode is reduced by virtue of an improved mounting arrangement for the rotating magnet assembly. One of the advantages of such a reduced stroke for the lower electrode is that the length (i.e., height) requirements for the bellows B are reduced. As a result, the bellows B are more stable. In the past, additional supports were required for the bellows since, without such supports, the bellows would begin to "squirm" as a result of atmospheric pressure acting upon the excessive bellows lengths required to accommodate for the lengthy stroke of the lower electrode.

In accordance with one of the advantageous aspects of the invention, a pneumatic drive is provided for raising and lowering the lower electrode. In the past, a threaded shaft drive was utilized, in which three threaded shafts are rotated by a motor and chain assembly in order to raise and lower the lower electrode. Such an arrangement was not only complicated and time consuming to manufacture and assemble, but also, if the shafts were not precisely mounted or aligned (i.e., aligned with respect to one another and the drive), the shafts could bind and jam. The arrangement of the present invention includes a pneumatic cylinder with an adjustable stroke, to provide a simpler arrangement which is more reliable, or at least, in need of less care or labor to ensure proper functioning. In addition, the drive arrangement of the invention requires less space, allowing additional components to be disposed below the lower electrode (in a particularly preferred arrangement, as discussed hereinafter, the wafer back cooling system is mounted below the lower electrode and moves with the lower electrode). As shown in FIG. 4, the arrangement includes a piston flange 54 which is shown in the raised position. By injecting a gas into the region below the piston 54, and/or removing gas from the region above the piston flange 54, the piston is raised, thus raising the lower electrode. Similarly, by injecting gas into the region above the piston flange 54 and/or removing gas from the region below the piston flange 54, the lower electrode is lowered. A stop 56 is provided for limiting the uppermost position of the piston and, as discussed further hereinafter, the stroke can also be varied if desired.

In accordance with a further aspect of the invention, an improved rotating magnet mounting assembly is provided. In the past, the rotating magnet assembly has been supported above bearings for rotation. In accordance with the present invention, as shown in FIG. 4, the magnets are suspended from a bearing assembly, such that the bearing mount for the magnets is above the magnets. As a result, the height of the chamber is reduced, as is the stroke required for raising and lowering the lower electrode 52. As shown in FIG. 4, and as discussed in further detail hereinafter, the bearing mount B for the magnets is disposed above the magnets (the magnets are designated with an X in the drawings). The wafers enter the chamber through a gate or access port P when the electrode 52 is in the lowered position. After a wafer is positioned upon the electrode 52, the electrode is raised to the desired location within the magnets. As discussed in further detail hereinafter with reference to FIGS. 5A and 5B, by suspending the magnets for rotation, rather than mounting the magnets on top of a rotating mount, the chamber height is reduced. This reduced height is beneficial in that the stroke required for the lower electrode 52 from the wafer receiving location to the etching location is reduced and problems with an excessive stroke, such as the time required for the stroke movement and squirming of the bellows, are avoided. This reduced height is also beneficial in reducing the vertical footprint of the chamber, thus allowing for easier access to the chamber for maintenance.

Mounted for movement with the piston drive assembly and lower electrode are the matching network or matching box 58, inlet and outlet coolant lines 60 for cooling the lower electrode (only one line 60 is shown in FIG. 4, the other is behind that shown), a motor drive assembly 62 for raising and lowering pins through the lower electrode (as is known in the art, the pins are raised to receive a wafer from the robot arm when the robot arm is extended through the port P, and after the wafer is positioned upon the pins and the arm is retracted and the pins are lowered so that the wafer is placed upon the lower electrode), and the RF power supply rod 64. In addition, in accordance with a further aspect of the invention and discussed further hereinafter, components of the wafer back cooling system (represented schematically at 59) are also mounted for movement with the lower electrode.

As shown in FIG. 4, the wafer back cooling system include two lines 59a, 59b for supplying a gas respectively to center and edge regions of the wafer. Although not to be construed as limiting, in a presently preferred form, helium is utilized as the gas which is supplied for assisting in the back cooling of the wafer. The helium acts as a bridge between the wafer and the lower electrode. As discussed above, the lower electrode is cooled utilizing a coolant supplied via line 60. However, particularly since the chamber is at a low pressure, if a gas is not supplied to the back side of the wafer, a poor thermal connection is provided between the wafer and the lower electrode. Thus, by supplying a gas to the back side of the wafer, microscopic voids between the wafer and the lower electrode are filled with the gas. The gas supplied to the back side of the wafer forms a thermal bridge between the wafer and the lower electrode to better thermally couple the wafer and lower electrode so that the wafer can be more effectively and more uniformly cooled. Details of the back cooling system, i.e., the helium gas supply for the back cooling are discussed hereinafter with reference to FIGS. 6A and 6B.

Figure 5B:
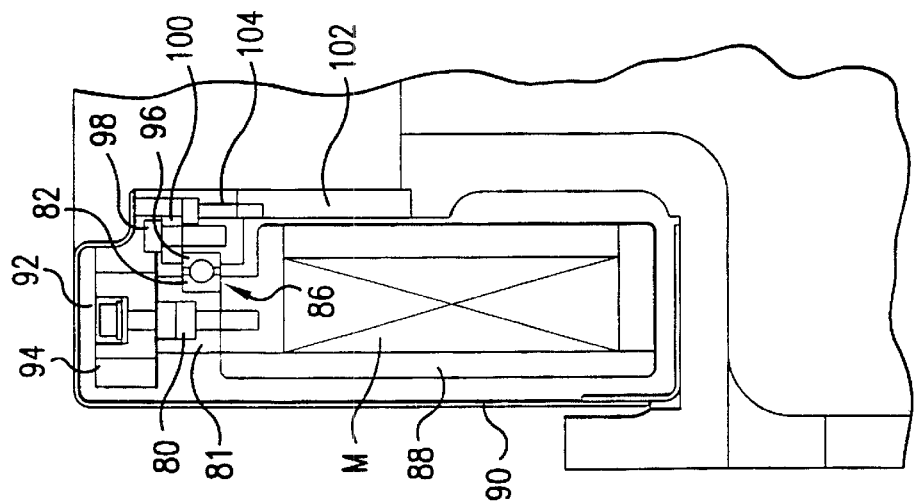
FIG. 5B depicts a mounting arrangement for a rotating magnet assembly in accordance with the invention.
Figure 5A:
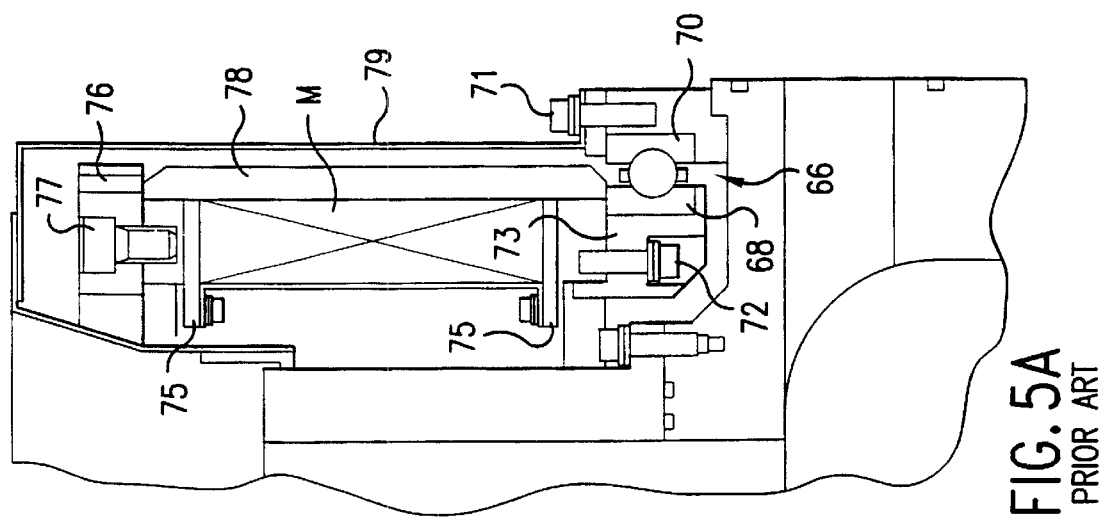
FIG. 5A depicts a prior bearing mount for a rotating magnet assembly.

Referring now to FIGS. 5A and 5B, a comparison of the rotatable mounting assembly for the magnets of the prior art (FIG. 5A) and the present invention (FIG. 5B) will be described. As shown in FIG. 5A, in the prior arrangement, the magnet assembly is an annulus or hollow cylinder, formed of a plurality of magnets M, which rotates about the chamber. The magnet assembly is rotatably mounted utilizing ball bearings 66, which have an inner bearing race 68 and an outer bearing race 70. A screw 71 holds the outer bearing race 70 in place, and the outer race is fixed. A further screw 72 clamps the inner bearing race in place via a clamp member 73, and the screw 72 further holds the clamp member 73 to the remainder of the magnet assembly. The inner race 68, clamp 73 and screw 72 all rotate with respect to the outer race. 70, thereby mounting the magnets M for rotation. The magnets are held in place by brackets 75, and are thus mounted to rotate about the chamber. A toothed ring gear is represented at 76, and is fastened to the magnet assembly via screw 77, and the toothed ring gear is rotated by a drive gear and motor (corresponding to the drives represented at 36, 38 and 40 in FIG. 2, but not shown in FIGS. 5A and 5B) to rotate the magnet assembly. A further casing part is shown at 78 for holding the magnets in place. In addition, a shield 79 is disposed about the assembly.

As should be apparent from a review of the drawing figures the height of the assembly of FIG. 5B is shorter than that of FIG. 5A, thus reducing the vertical footprint of the chamber and making access to the chamber more convenient, and also reducing the stroke required for raising and lowering the lower electrode.

In the FIG. 5B arrangement, as discussed earlier, the magnet assembly is suspended for rotation rather than being supported atop a rotatable mount. In the arrangement shown, a screw 80 holds the outer race 82 of the ball bearing assembly 86 to the rotating assemblage of magnets M. The magnets M are disposed within a sleeve 88, and a shield 90 is disposed about the assembly. The sleeve 88 and shield 90 can be formed, e.g., of 400 stainless steel. A further screw 92 holds the ring gear 94 to the clamp 81 (by which the screw 80 clamps the bearing race 82). Thus, when the ring gear 94 is driven, the clamp 81, screw 80, outer bearing race 82 and the sleeve 88 (which holds the magnets M) are rotated.

The inner race 96 is fixed via the screw 98 which clamps the inner race via a clamp member 100. The precise height of the magnet assembly is determined by a ring spacer member 102 which is held in place by a further screw 104. If desired, the height of the magnet assembly can be varied by replacing the ring spacer 102 with a spacer of a different size. As is apparent, the FIG. 5B arrangement provides a reduction in the height of the chamber. It is to be understood that mounting arrangements other than that shown in FIG. 5B are possible in accordance with the invention in order to provide a mount above the magnet assembly or adjacent the top of the magnet assembly rather than supporting the magnets from below as in the prior arrangement. Alternately, the magnet assembly can be supported at a location above the bottom of the magnets but beneath the top of the magnets, while nevertheless achieving a height reduction (since the lower electrode need not traverse the bearing height before it is moved up in the magnet assembly). However, it is presently preferred to mount the magnet assembly at a location above the magnets.

Figure 6C:
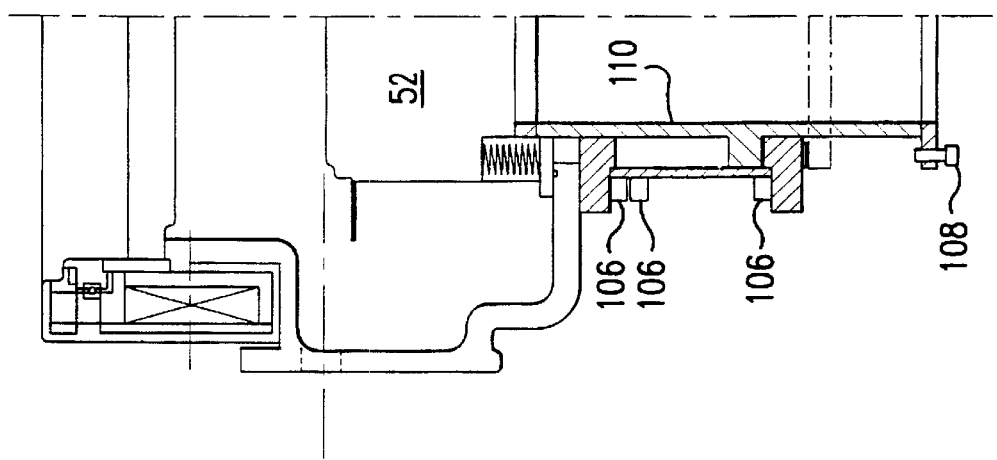
FIGS. 6A–C depict various lower electrode positions provided by the drive assembly of the invention.
Figure 6B:
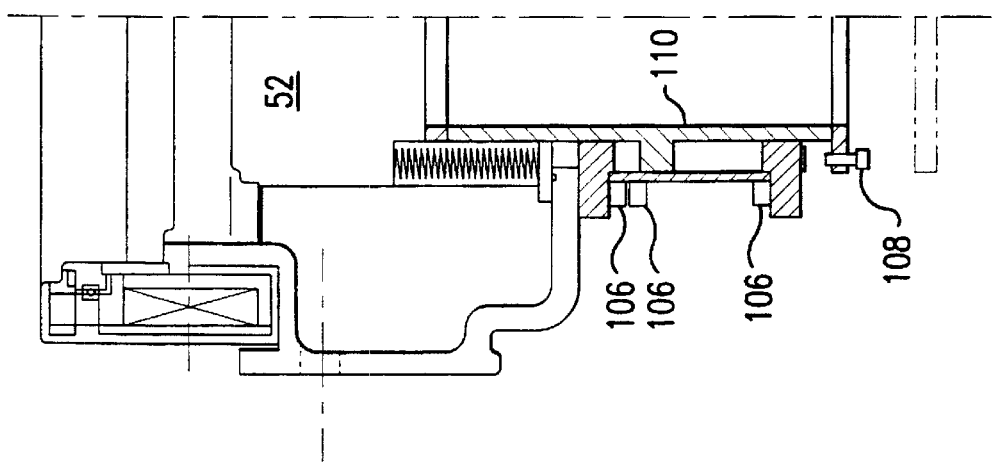
Figure 6A:
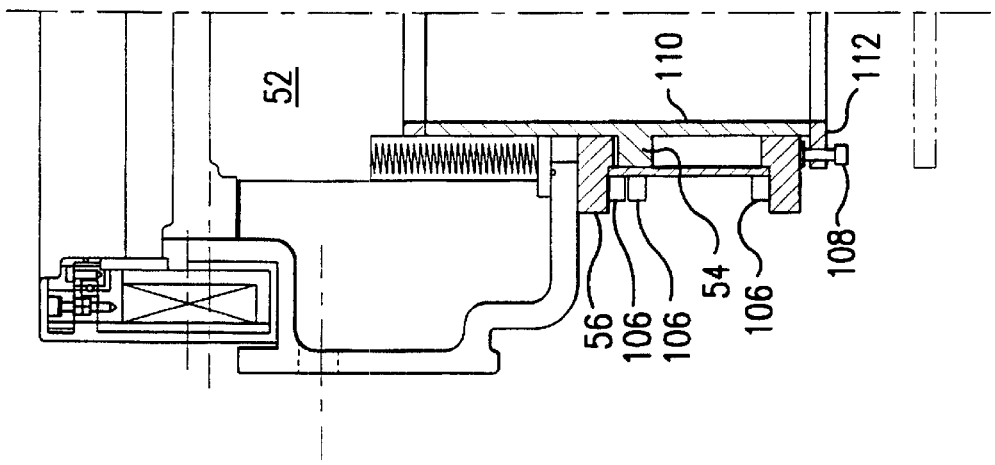

Referring now to FIGS. 6A–6C, additional details of the operation of the pneumatic piston assembly for raising and lowering the lower electrode 52 will be described. FIG. 6A depicts the lower electrode in the uppermost position which can be utilized, for example, for processing or etching. FIG. 6B shows the intermediate position which can be utilized, for example, for a cleaning process, or for an alternate etching process. FIG. 6C shows the lowermost position which can be utilized for placing a wafer upon or removing a wafer from the lower electrode 62. Sensors 106 are provided for sensing the position of the piston flange 54 to thereby control the gas feed to the pneumatic drive arrangement and thus control the positioning of the piston flange 54 and the corresponding position of the lower electrode 52. As shown in FIG. 6A, a screw 108 is provided on the lower end of the drum or cylinder 110 to which the piston flange 54 is mounted. The uppermost position of the piston flange 54 is limited by the stop 56. In addition, to shorten the stroke of the drive so that the piston flange 54 is halted prior to reaching the stop 56, the screw 108 can be adjusted so that it extends further through the flange 112. Thus, the gap between the upper and lower electrodes during etching can be adjusted by adjusting the screw 108.

Figure 7A:
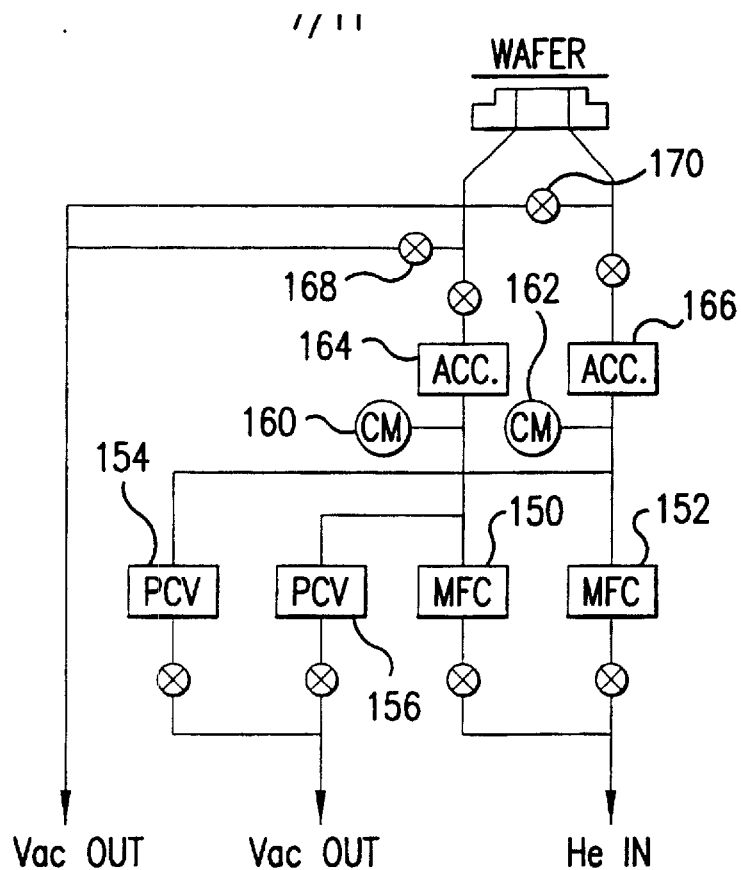
FIG. 7A depicts a prior wafer back cooling system for the lower electrode.
Figure 7B:
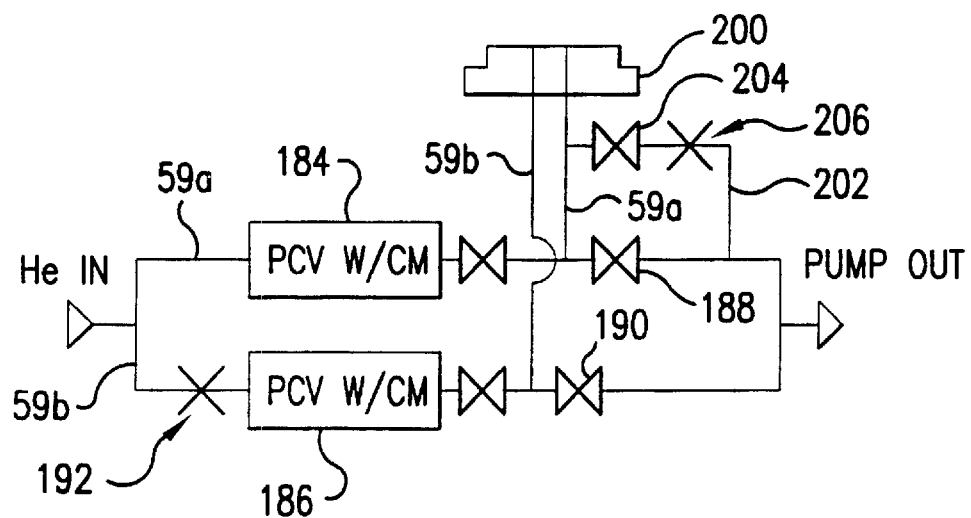
FIG. 7B depicts a wafer back cooling arrangement in accordance with the present invention.

Referring to FIGS. 7A and 7B, a prior back cooling system and a back cooling system in accordance with the present invention will be described. As discussed earlier, the back cooling system supplies a gaseous medium, such as helium, to the back of the wafer through apertures in the lower electrode or electrostatic chuck to provide better thermal coupling between the wafer and the lower electrode. (The lower electrode is often referred to as the electrostatic chuck, since it is often configured such that it will hold the wafer during etching with an electrostatic charge.) Since the lower electrode is cooled (by a cooling medium supplied by lines 60 as shown in FIG. 4), excessive overheating of the wafer is thereby prevented. Two helium lines are provided, one of which provides a flow of helium to the center of the wafer via apertures located in the center of the electrostatic chuck, and another for supplying helium to the edge of the wafer via apertures located in the edge region of the electrostatic chuck.

In the prior system as shown in FIG. 7A, since the control components were disposed remote from the chamber, the system was slow to respond to changes required in the helium flow rate. In addition, a large number of control components were required, thus making the system more complex and expensive than desired. In the FIG. 7A arrangement, the helium would be supplied from a source, and mass flow controllers 150, 152 would control the mass flow rate. Pressure control valves 154, 156 would control the pressure by venting or pumping out helium so that the desired pressure was achieved. Capacitance manometers 158, 160 would sense the pressure, and the sensed pressure was utilized for controlling the pressure control valves. In addition, a pair of accumulators 164, 166 were required to provide a reservoir and ensure an adequate supply of helium to the backside of the wafer. At certain times, it was also necessary to remove the helium from the electrostatic chuck via valves 168, 170, for example, to pump-down the backside cooling system when the chamber is down (not in use), or if it is desired to shut-off the helium flow, for example, when the wafer is being exchanged/replaced to prevent floating of the wafer until the wafer is chucked.

As can be seen from the FIG. 7A arrangement, a large number of components were required, including pairs of pressure control valves, mass flow controllers, capacitance manometers and accumulators, as well as a number of valves for opening and closing the various lines. A further shortcoming with the FIG. 7A arrangement occurred when a wafer was not properly placed upon the electrostatic chuck, for example, if a wafer was broken, improperly positioned on the chuck, or if a wafer exchange failed (so that a wafer is not present on the chuck). Upon such occurrences, the flow of helium to the wafer would continue even without a wafer and the cooling system would continue to flow gas to the electrostatic chuck at a rate to obtain the desired pressure without halting or interrupting the chamber operation.

The FIG. 7B arrangement is much simpler and more reliable than that of the prior FIG. 7A arrangement. In accordance with one of the advantageous aspects of the invention, the components between the "He in" and the "Pump out" are part of the backside cooling system which is mounted below the chamber for movement with the lower electrode assembly as represented schematically at 59 in FIG. 4. As in the prior arrangement, two lines 59a, 59b respectively supply the heat transfer medium to the center and edge regions of the electrostatic chuck and wafer. By providing the control system in close proximity to the chamber, the number of components of the system can be reduced. For example, accumulators are not needed. Further, in lieu of the use of mass flow controllers in combination with capacitance manometers and pressure control valves, a combined pressure control valve and capacitance manometer component is placed in each of the lines 59a, 59b as shown at 184, 186, and the mass flow controllers have been eliminated. Valves 188, 190 are also provided to vent the system when the chamber is down or not in use. Otherwise, during the supply of helium to the electrostatic chuck, the valves 188, 190 are closed.

In accordance with one of the advantageous aspects of the invention, a reduced orifice or fixed orifice is provided as shown at 192. The reduced orifice 192 is advantageous in providing an upper limit of the mass flow which can be supplied by the system. Thus, if a wafer is not properly positioned upon the electrostatic chuck 200, or if a wafer is broken or missing, the flow of the system is limited or choked by the fixed orifice. As a result, if a wafer is not present (or is broken or improperly fed), the system cannot achieve the desired pressure and, after a period of time as elapsed, the control system of the etcher will "time-out" and will shut the chamber down. The reduced or fixed orifice 192, can be provided by a number of expedients. For example, a needle valve can be utilized which is set to a desired orifice, or any other expedient can be utilized for providing the desired fixed orifice size. The use of a fixed orifice is desirable as compared with providing a reduction in the line sizes (which also would limit the flow), since such a reduced line size would require the use of non-standard sized lines, and the lines would require replacement whenever it is desired to provide a change in the orifice size. Thus, the use of a fixed orifice which can be replaced or modified as desired (depending upon the desired pressure conditions) is preferred. The orifice size is selected such that the maximum flow allowed by that orifice will be unable to achieve the desired pressure (within the pressure tolerance range) when a wafer is not present on the lower electrode or electrostatic chuck. The reduce orifice is needed on the inlet side of only one of the lines, since the reduced orifice will prevent the system from achieving the desired pressure when a wafer is not present. Preferably, the reduced or fixed orifice 192 is provided on the inlet edge line 59b of the FIG. 7B arrangement, since the pressure and flow in the edge line is typically higher than that for the line which provides helium to the center of the electrostatic chuck, and the pressure and flow in the edge line is thus more suitable for interrupting the operation of a chamber if a wafer is not properly positioned on the lower electrode. For example, the range of pressures for the edge line can be 15–60 Torr, while that for the center line can be 3–40 Torr, with the pressure for the edge line typically selected so that it is larger than that for the center line. In addition, the edge line pressure is preferably higher than the chamber pressure. With this arrangement, the flow at the edge of the wafer will act as a lock or gas curtain, such that process gases do not enter the region underneath the wafer. Further, since the desired edge pressure is higher than the desired center pressure, a dump line 202 is provided, with a valve 204 and fixed orifice 206 disposed along the dump line 202. The dump line will thus prevent the edge pressure from increasing the pressure at the center of the electrostatic chuck, so that the center pressure can be properly controlled and the edge pressure will not raise the center pressure above that desired.

As will be apparent from the foregoing, the number of components of the system of FIG. 7B is less than that required for FIG. 7A. In addition, since the system is disposed closer to the chamber, the helium flow can respond more quickly and can stabilize more quickly as compared with the prior system. Further, by utilizing the fixed orifice 192, the system will "time-out" if the desired pressure is not achieved due to a wafer improperly placed or not placed upon the electrostatic chuck 200, or if the wafer is broken.

A further advantage of the back cooling arrangement of the present invention is that the cooling gas consumption is lower as compared with the prior arrangement. This should be apparent from the prior arrangement, both the inlet and outlet lines of FIG. 7A included dumping lines (via valves 168, 170), and in addition, the pressure was controlled by venting the cooling gas via PCV's 154, 156. Further, as discussed earlier, if a wafer was not present on the lower electrode, the cooling gas flow would continue into the chamber, thereby further wasting cooling gas. By contrast, with the arrangement of the invention, the fixed orifice sets a maximum flow rate, even when a wafer is not present on the lower electrode, and the system will "time-out" after a predetermined period of time has elapsed and the desired pressure has not been achieved. Further, the pressure is controlled utilizing the combined PCV and capacitance manometer components, without venting access cooling gas in order to control pressure. Further, only a single dump line is utilized as compared with the pair of dump lines in the prior arrangement. The arrangement of the invention is also advantageous in that, since the control components of the system are disposed near to the location at which the flow is to be controlled (i.e., at the lower electrode), the system can respond more quickly to require changes in the flow.

As should be apparent from the foregoing, the wafer back cooling arrangement of the invention is advantageous in a number of respects. The system is simpler as compared with the prior arrangement, and is also more reliable and can respond more quickly as compared with the prior arrangement. Further, the system of the invention is advantageous in that it consumes less cooling gas.

Figure 8A:
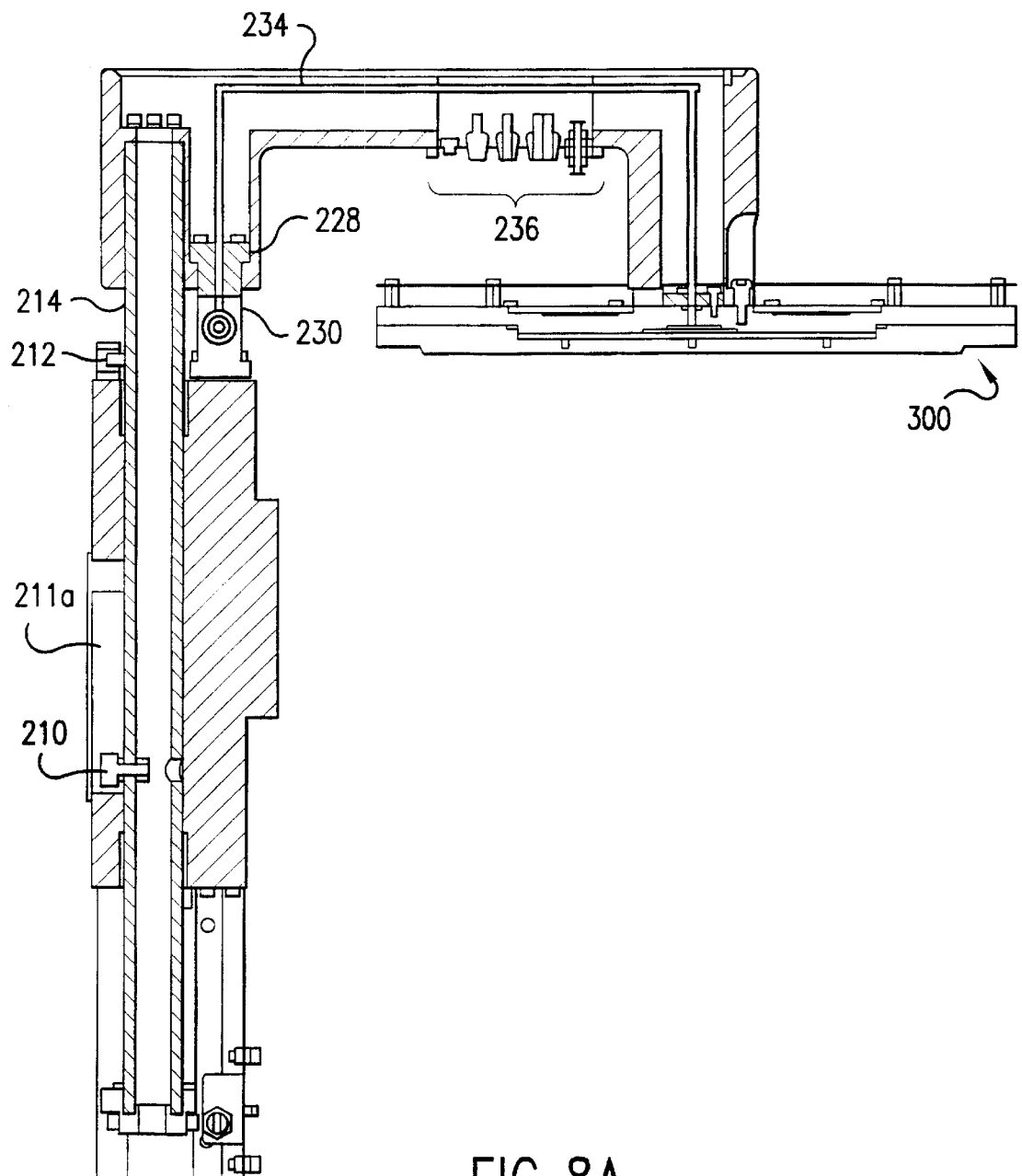
FIGS. 8A–8C depict a support or mounting assembly for the chamber lid and upper electrode assembly in accordance with the present invention.
Figure 8B:
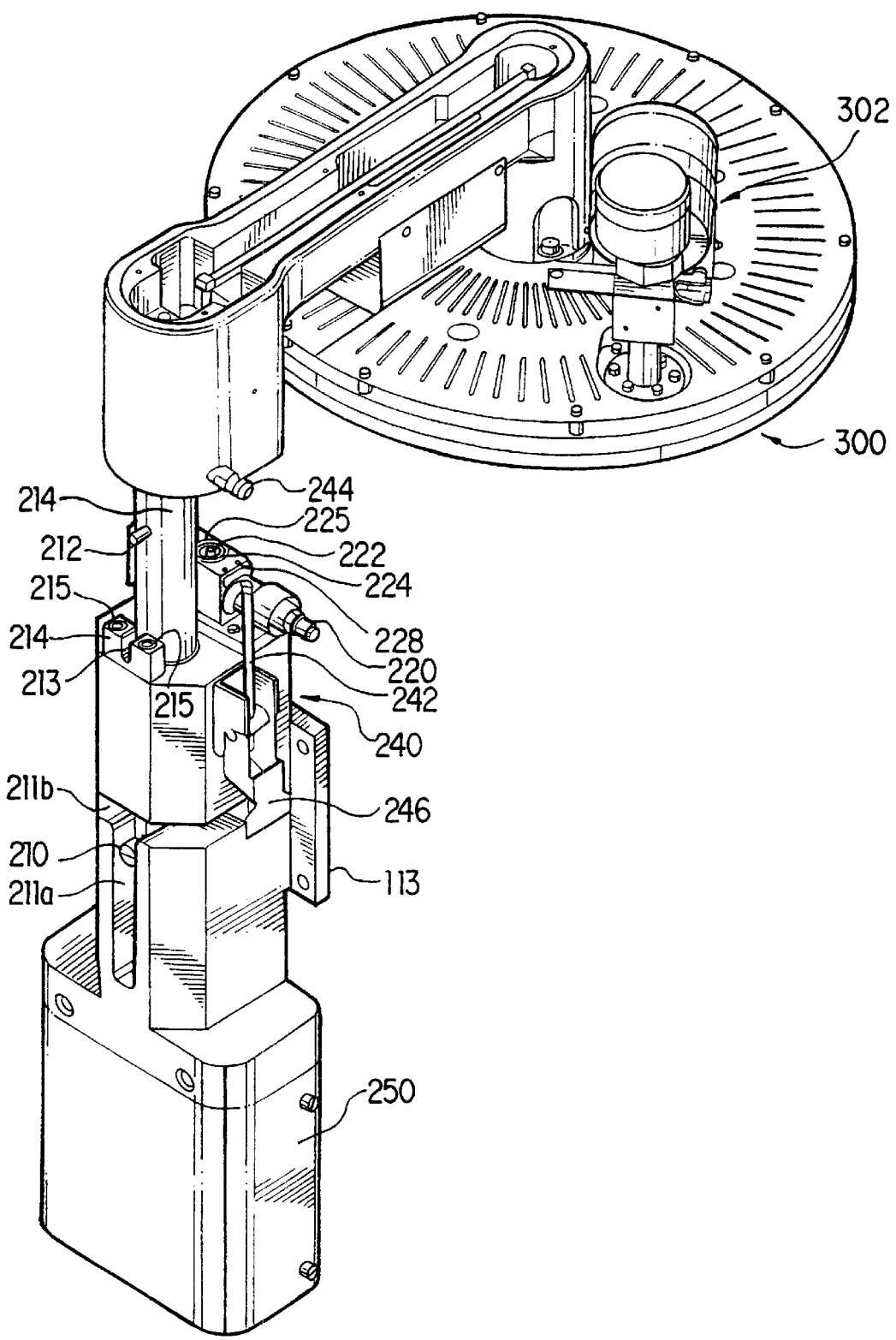
Figure 8C:
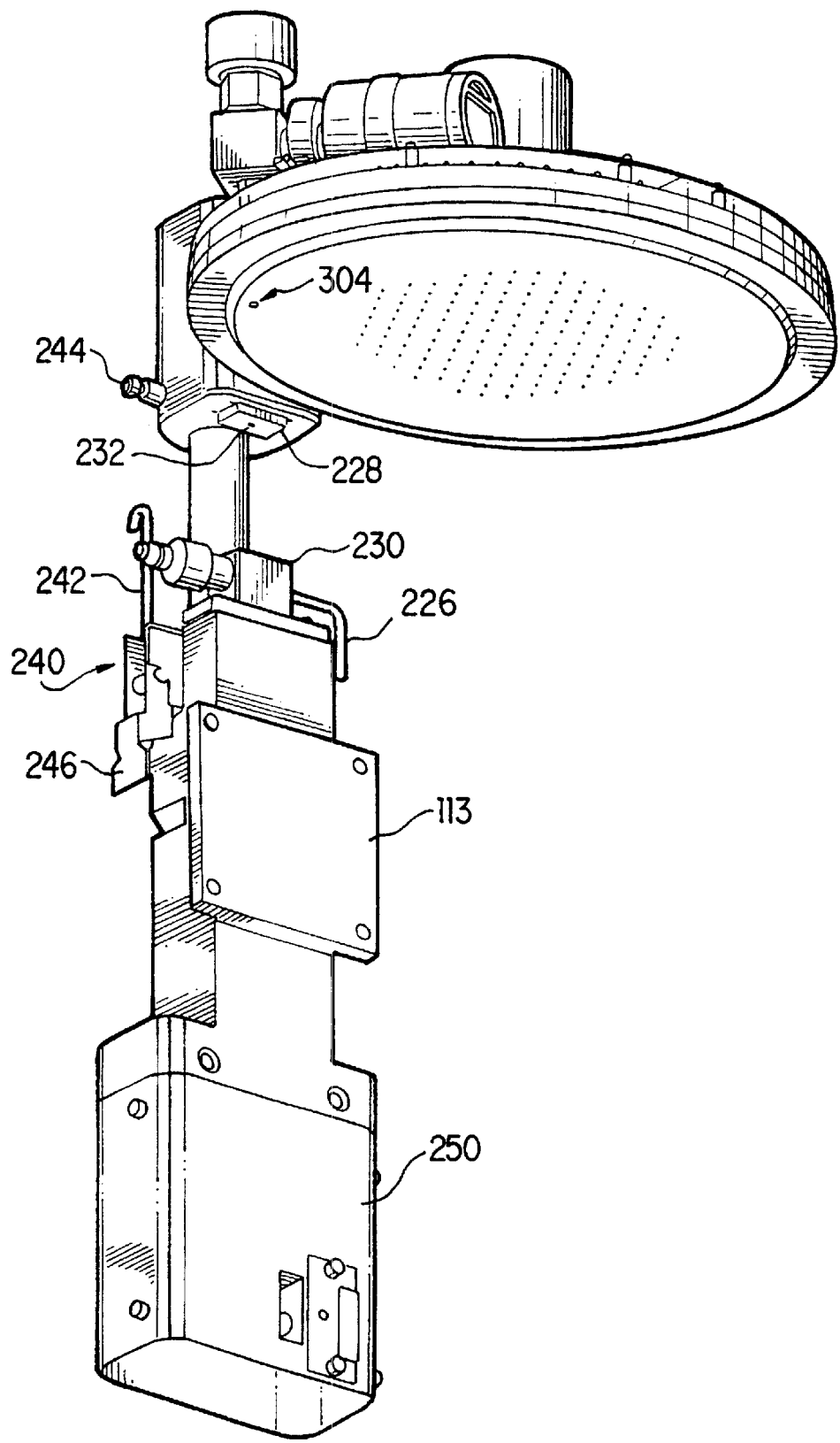

Referring now to FIGS. 8A–8C, details of the upper electrode mounting structure will be described. In the position shown in FIG. 8A, the arm is in the lowered position, while in FIG. 8B, the arm is partially raised. As shown in FIG. 8A, in the lowered position, a pair of pins 210, 212 are mounted to a vertically movable shaft or cylinder 214 of the assembly. The pins 210, 212 ensure that when the arm is lowered, it is properly aligned so that it is received within the upper opening of the chamber. Preferably, the lower pin 210 is in the form of a stainless roller, such that it acts as a cam follower as it moves along vertical and horizontal slots disposed in the lid mounting assembly. As shown in FIG. 8B, a vertical slot 211a allows the arm to move vertically when it is positioned above the chamber, to raise and lower the upper electrode assembly 300. When the upper electrode is in the fully raised position, it can pivot, by virtue of the horizontal slot 211b. Thus, in the raised position, the arm can pivot, however when the upper electrode assembly is being lowered, the horizontal or pivotal movement is inhibited by the slot 211a. As it is being lowered, there will nevertheless be a small amount of play of the follower 210 within the slot 211a, since otherwise, it will be costly to precisely machine the slot 211a and follower 210 with acceptable tolerances, and to precisely mount the arm assembly so that when the upper electrode assembly 300 is lowered it is properly positioned within the upper opening of the chamber. Thus, the follower 210 and slot 211a provide a coarse horizontal positioning of the upper electrode assembly 300 with respect to the opening of the chamber, and a finer or more exact positioning is provided by the pin 212 and slot 213. With this arrangement, as the upper electrode assembly 300 is being lowered, the pin 212 is received within slot 213 just prior to the upper electrode assembly entering the upper open end of the chamber to provide the final, precise positioning of the upper electrode assembly. Preferably, the slot 213 is adjustable. For example, in the arrangement shown in FIG. 8B, the slot 213 is disposed in a saddle member 214, which in turn is adjustably mounted via fasteners 215. With this arrangement, the location of the slot 213 can thus be adjusted after the arm assembly is mounted upon the chamber. In particular, when the arm assembly is first mounted upon the chamber, the saddle member 214 is not tightly fastened to the arm assembly and can move horizontally. When the lid mounting assembly is mounted upon the chamber, the upper electrode assembly 300 is positioned in the top of the chamber, and in this position, the proper location of the slot 213 and saddle 214 is thereby determined, with the pin 212 disposed in the slot. The fasteners 215 are then tightened so that later, when the upper electrode assembly 300 is raised for maintenance, it is easily returned to the exact position determined during initial mounting (since the slot 213 provides the fixed reference position for the upper electrode assembly 300).

The process gases are fed to the upper electrode assembly via inlet connector 220, and the process gases are then fed to a location 222, which is surrounded by a pair of O-ring seals 224. Preferably at least one orifice 225 is disposed between the O-ring seals 224, and the orifice 225 is connected to a low pressure source, such that a negative or reduced pressure is present in the region between the O-ring seals. As a result, process gases are prevented from leaking out of the system, since any process gases which should escape from the inner O-ring seal are evacuated. In addition, contaminant gases are prevented from entering the chamber, since any ambient gases which should pass over the external O-ring seal are also evacuated. As shown in FIG. 8C, a line 226 is provided for the reduced pressure orifice 225, and the line is connected to a suitable pump, so that the region between the O-ring seals 224 is at a reduced pressure.

As also shown in FIG. 8C, a stainless upper block 228 is disposed on the upper, movable portion of the arm assembly, and when the upper electrode assembly 300 is lowered, the block 228 abuts with the block 230 on the lower, fixed part of the arm assembly. An aperture 232 in the upper block 228 receives the gas fed via connector 220 and orifice 222, with the O-ring seals 224, together with the reduced pressure lock (via opening 225 and reduced pressure line 226) form a seal between the blocks 228, 230, so that the gas is fed through the aperture 232, and then to the upper electrode assembly 300 via line 234 (FIG. 8A) disposed in the upper arm portion of the lid mounting assembly. As shown in FIG. 8A, a series of additional gas and electrical fitments 236 can be provided in the upper arm portion of the lid mounting assembly to provide suitable connections for utilities supplies for operation of the chamber and upper electrode assembly. For example, such lines can provide a connection for pressure measurements, a connection for a heater, a heater shut-off switch, etc. For example, one of the connections can be utilized for a capacitance manometer as shown at 302 (FIG. 8B), which senses pressure via an aperture 304 (FIG. 8C). Further, an isolation valve for the capacitance manometer must be provided, so that the aperture 304 is only open when a pressure measurement is being taken.

As shown in FIG. 8B, a lid on the upper arm portion of the assembly (the lid is removed in FIG. 8B) is provided to allow access to the interior portion of the upper arm. The arrangement of the invention is advantageous in that, the process gases and other utilities are fed through the upper arm portion of the assembly, which are easily accessed. By contrast, if the gas were fed, for example, from the bottom the arm assembly, it would be difficult to manufacture the arm assembly so that the entire portion through which gas is fed is accessible. The arrangement of the invention is also advantageous in that the location at which the seal is broken (i.e., between blocks 228 and 230) when the arm is raised is also readily accessible. Thus, when the arm is raised for maintenance, the blocks 228, 230 can be wiped to prevent any debris from accumulating at these locations, to thereby further ensure that a good seal is provided between the blocks 228, 230, and also to prevent any debris from entering the system via aperture 232.

As shown in FIGS. 8B and 8C, a latch assembly 240 is provided for locking the upper electrode assembly in the lowered or closed position. Once the electrode assembly 300 is in place, a hook 242 of the fixed portion of the assembly is positioned around a projection or nub 244 of the movable portion of the assembly. A lever 246 is then moved downward (it is depicted in the downward position in FIGS. 8B and 8C) to lock the nub 244, and thus the upper electrode assembly 300 in place.

Preferably, a spring assembly is provided for negating or lightening the load of the upper electrode assembly. In a presently preferred form, a constant force spring is provided within the housing 250, and the constant force spring applies a force to the rod or cylinder 214 equal to the weight of the movable portions of the upper arm assembly and upper electrode assembly. Thus, vertical movement of the upper electrode assembly is easily achieved. Although a constant force spring is utilized in a presently preferred embodiment, it is to be understood that alternate load lightening expedients can be utilized. For example, a pressurized cylinder could be utilized as an alternative to the use of a constant force spring.

As will apparent from the foregoing, the chamber lid mounting assembly provides a number of advantages as compared with prior arrangements in that the assembly allows for flexible positioning of the upper electrode assembly during maintenance, and the assembly is also safer and simpler to maintain. For example, the assembly is safer in that the weight of the lid is in the same direction or along the same axis (i.e., vertically) when the lid is being raised, and in addition, the stroke of the lid is limited (since the lid will only continue to be raised until the pin or cam follower 210 reaches the top of the horizontal slot 211b), such that the lid will not fly away as could be the case with the prior spring loaded hinged mounted lids. Further, as discussed earlier, by utilizing a universal mount, with the mounting flange 113 mountable upon a corresponding mounting site of the chamber, the location at which the arm assembly is positioned can be varied and, additionally if desired, the universal mount site on the chamber can be utilized for other components (such as a drive mount for a rotating magnet assembly if the chamber includes such an assembly).

Figure 9:
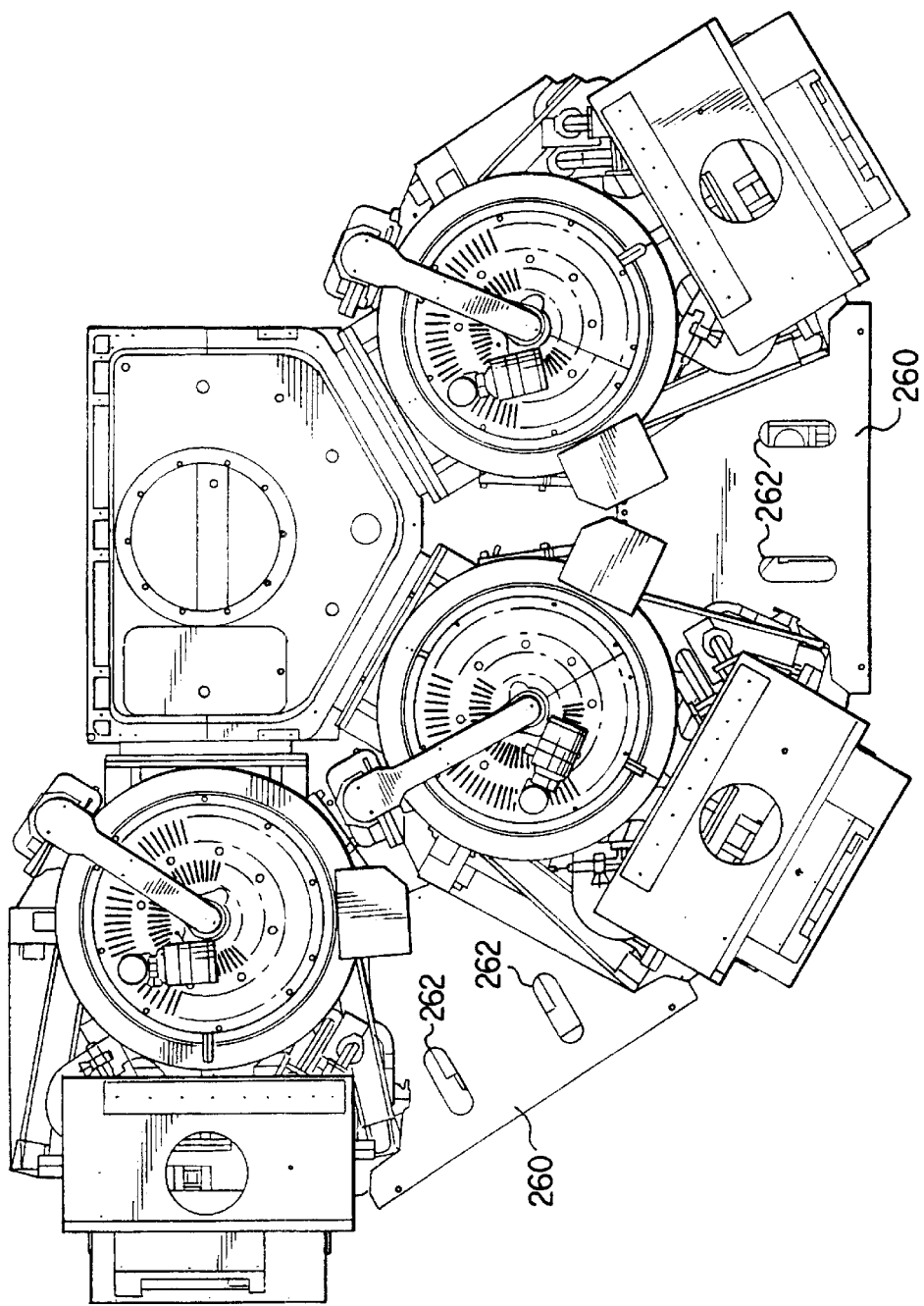
FIG. 9 depicts an arrangement of support platforms for maintenance personnel in accordance with a further aspect of the invention.

Referring briefly to FIG. 9, a further advantageous aspect of the invention is shown. In particular, as shown in FIG. 9, a removable plate 260 is preferably positioned between each of the chambers. Preferably, the tops of the plates 260 have a diamond plate surface to prevent slipping. The plates are mounted to the facilities frames which are positioned between the process chambers, so that once the chambers are positioned and mounted to the transfer chamber, the plates 260 provide a convenient platform upon which maintenance personnel can stand for maintenance of the chambers. Apertures 262 act as handles for positioning and removing the plates 260, so that the plates 260 are easily handled when they are mounted and dismounted. The plates 260 also provide a convenient storage location for various utilities/facilities distribution systems, for example, systems for helium, nitrogen, water and air. For example, in a present form, the helium and nitrogen facilities boxes are housed underneath the plate 260 disposed at the bottom of FIG. 9, while the water and air facilities boxes are disposed underneath the plate 260 which is between the left two chambers of FIG. 9.

What is claimed is:

1. An etching system comprising:
   at least one workpiece cassette for holding a plurality of workpieces;
   a plurality of etching chambers for etching said workpieces;
   a transfer chamber for transferring workpieces between said cassette and at least one of said plurality of etching chambers;
   wherein said plurality of etching chambers are each adapted to be selectably and fixedly mounted at different positions with respect to said transfer chamber.

2. An etching system as recited in claim 1, wherein each of said plurality of etching chambers includes a lid and a lid mounting assembly for holding the lid in open and closed positions, and wherein the lid mounting assembly is disposed at a mounting site associated with each chamber, and further wherein a plurality of said mounting sites are associated with each chamber such that the lid mounting assembly can be selectably positioned with respect to each chamber.

3. An etching system as recited in claim 2, wherein each mounting site is adapted to receive and support at least one other chamber component.

4. An etching system as recited in claim 3, wherein at least one of said chambers includes a rotating magnet assembly, and further wherein said at least one other component includes a drive assembly for said rotating magnet assembly.

5. An etching system as recited in claim 1, wherein at least one of said chambers includes a rotating magnet assembly, and wherein said rotating magnet assembly is mounted for rotation by a rotary mounting assembly disposed above the rotating magnet assembly.

6. An etching system as recited in claim 5, wherein said rotary mounting assembly includes a bearing assembly having an inner race and an outer race, and wherein said outer race is disposed radially outside of said inner race, and further wherein said outer race rotates with respect to said inner race and said rotating magnet assembly is coupled to said outer race.

7. An etching system as recited in claim 1, wherein at least one of said chambers includes a movable lower electrode, and a cooling system for supplying a cooling gas to a surface of a wafer disposed on said movable lower electrode, and further wherein said cooling system is mounted for movement with said movable lower electrode.

8. An etching system as recited in claim 7, further including a pneumatic drive assembly for raising and lowering the movable lower electrode.

9. An etching system as recited in claim 1, further including a pneumatic drive assembly for raising and lowering the movable lower electrode.

10. An etching system as recited in claim 9, wherein said pneumatic drive assembly has a variable stroke.

11. An etching system as recited in claim 9, further including means for controlling said pneumatic drive to position said movable lower electrode at at least three positions.

12. An etching system as recited in claim 1, wherein at least one of said chambers includes a lower electrode and a cooling system for supplying a cooling gas to a surface of a wafer disposed on said lower electrode, and wherein said surface of said wafer faces said lower electrode.

13. An etching system as recited in claim 12, wherein said cooling system comprises a first cooling gas supply line for supplying a cooling gas to a central region of said wafer and a second cooling gas supply line for supplying a cooling gas to an edge region of said wafer.

14. An etching system as recited in claim 13, further including means for controlling pressures of said cooling gas such that a pressure of the cooling gas supplied to the edge region of said wafer is higher than a pressure of the cooling gas supplied to said central region of said wafer.

15. An etching system as recited in claim 14, wherein said cooling system further includes at least one reduced orifice for limiting a maximum flow rate of cooling gas in one of said first and second cooling gas supply lines.

16. An etching system as recited in claim 1, wherein at least one of said chambers includes a lid and a lid mounting assembly, and wherein said lid mounting assembly includes a shaft which is vertically movable and which is pivotable about a vertical axis such that lid is vertically movable to open said lid and such that when said lid is in an open position said lid is pivotably movable about said vertical axis.

17. An etching system as recited in claim 16, further including at least one cam surface, and wherein a cam follower is connected to said shaft such that movement of said shaft is limited by said cam surface and said cam follower.

18. An etching system as recited in claim 1, wherein said etching chambers each include a self-supporting framed structure such that said etching chambers can be detached from said transfer chamber and are self-supporting when detached from said transfer chamber.

19. An etching system as recited in claim 18, wherein said etching chamber each include a plurality of feet having rollers.

20. An etching system as recited in claim 19, wherein each of said etching chambers further includes a plurality of non-rollered feet, and wherein said rollered feet and said non-rollered feet are retractably mounted upon said frame.

\* \* \* \* \*